US012087549B2

(12) United States Patent
Le et al.

(10) Patent No.: US 12,087,549 B2
(45) Date of Patent: Sep. 10, 2024

(54) DEMAGNETIZING COILS FOR LINEARITY IMPROVEMENT OF CURRENT RATIO OF PLASMA PROCESSING SYSTEMS

(71) Applicant: MKS Instruments, Inc., Andover, MA (US)

(72) Inventors: Dinh-Vuong Le, Yuseong-gu (KR); Jaechul Jung, Sejong (KR); Hohyoung Lee, Yuseong-gu (KR); Jeongseok Jang, Sejong-si (KR); Ngoc-Hung Nguyen, Yuseong-Gu (KR)

(73) Assignee: MKS Instruments, Inc., Andover, MA (US)

( * ) Notice: Subject to any disclaimer, the term of this patent is extended or adjusted under 35 U.S.C. 154(b) by 126 days.

(21) Appl. No.: 17/566,274

(22) Filed: Dec. 30, 2021

(65) Prior Publication Data
US 2023/0215695 A1 Jul. 6, 2023

(51) Int. Cl.
*H01J 37/32* (2006.01)

(52) U.S. Cl.
CPC ..... *H01J 37/32183* (2013.01); *H01J 37/3211* (2013.01)

(58) Field of Classification Search
CPC ............ H01J 37/32183; H01J 37/3211; H01J 37/321; H01J 37/32174; H01J 37/32266; H05H 1/46; H05H 1/4652; H01L 21/31116

See application file for complete search history.

(56) References Cited

U.S. PATENT DOCUMENTS

| 6,507,155 | B1 | 1/2003 | Barnes et al. |
| 6,617,794 | B2 | 9/2003 | Barnes et al. |
| 7,602,127 | B2 | 10/2009 | Coumou |
| 8,110,991 | B2 | 2/2012 | Coumou |
| 8,395,322 | B2 | 3/2013 | Coumou |
| 9,305,750 | B2 | 4/2016 | Long et al. |
| 10,049,857 | B2 | 8/2018 | Fisk, II et al. |

(Continued)

FOREIGN PATENT DOCUMENTS

| KR | 10-2021-0042562 A | 4/2021 |
| KR | 10-2021-0140927 A | 11/2021 |

OTHER PUBLICATIONS

International Search Report and Written Opinion regarding International Application No. PCT/US2022/043407, dated Jan. 2, 2023.

(Continued)

*Primary Examiner* — Renan Luque
(74) *Attorney, Agent, or Firm* — Harness, Dickey & Pierce, P.L.C.

(57) ABSTRACT

A RF power generator has a RF power source configured to generate an output signal. A power splitter is configured to receive the output signal and generate a plurality of split signals. A demagnetizing circuit is configured to receive the plurality of split signals. The demagnetizing circuit is configured to include a plurality of inductances corresponding to the plurality of split signals. The plurality of inductances is configured to reduce the effects of mutual impedance of an ICP chamber in series with the plurality of inductances so that a ratio between a pair of the plurality of split signals varies substantially linearly as one of the pair of the plurality of split signals is varied.

20 Claims, 9 Drawing Sheets

(56) References Cited

U.S. PATENT DOCUMENTS

| | | |
|---|---|---|
| 10,546,724 B2 | 1/2020 | Radomski et al. |
| 10,600,618 B2 | 3/2020 | Galstyan et al. |
| 10,821,542 B2 | 11/2020 | Nelson et al. |
| 2001/0054383 A1 | 12/2001 | Pu et al. |
| 2011/0155694 A1 | 6/2011 | Jang et al. |
| 2013/0200043 A1 | 8/2013 | Tojo et al. |
| 2013/0256271 A1* | 10/2013 | Panagopoulos ...... H01J 37/3211 156/345.35 |
| 2018/0315580 A1* | 11/2018 | Melikyan ................ H03H 7/40 |
| 2020/0219708 A1* | 7/2020 | Long .................... H01J 37/3211 |
| 2023/0197409 A1* | 6/2023 | Kim ...................... H01J 37/321 156/345.28 |

OTHER PUBLICATIONS

Taiwanese Office Action regarding Patent Application No. 111135315, dated Oct. 6, 2023.

* cited by examiner

DEMAGNETIZING COILS FOR LINEARITY IMPROVEMENT OF CURRENT RATIO OF PLASMA PROCESSING SYSTEMS

FIELD

The present disclosure relates to RF generator systems and to control of RF generators.

BACKGROUND

Plasma fabrication is frequently used in semiconductor fabrication. In plasma fabrication, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator are precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In some aspects, the techniques described herein relate to a RF power generator including a RF power source configured to generate an output signal; a power splitter configured to receive the output signal and generate a plurality of split signals; and a demagnetizing circuit configured to receive the plurality of split signals, the demagnetizing circuit configured to include a plurality of inductances corresponding to the plurality of split signals, wherein the plurality of inductances is configured to reduce the effects of mutual impedance of an ICP chamber in series with the plurality of inductances so that a ratio between a pair of the plurality of split signals varies substantially linearly as one of the pair of the plurality of split signals is varied.

In some aspects, the techniques described herein relate to a RF power generator wherein the plurality of inductances may be one of a coil having an inductance or an induced inductance from conducting electrical current through an electrical conductor.

In some aspects, the techniques described herein relate to a RF power generator wherein the demagnetizing circuit includes a plurality of outputs, the plurality of outputs corresponding to a respective one of a plurality of antennas of an ICP chamber, and a combined mutual inductance of the plurality of inductances corresponding to the plurality of split signals is substantially equal to a combined mutual inductance of the plurality of antennas of the ICP chamber.

In some aspects, the techniques described herein relate to a RF power generator further including a matching network configured to receive the output signal from the RF power source and provide the output signal to the power splitter, the matching network configured to provide an impedance match with the RF power source.

In some aspects, the techniques described herein relate to a RF power generator wherein the demagnetizing circuit is positioned between the power splitter and a load.

In some aspects, the techniques described herein relate to a RF power generator wherein a load is positioned between the demagnetizing circuit and the power splitter.

In some aspects, the techniques described herein relate to a RF power generator wherein the plurality of inductances is two, and the demagnetizing circuit has an inner inductance and an outer inductance, wherein the inner inductance corresponds to an inner coil of an ICP chamber and the outer inductance corresponds to an outer coil of the ICP chamber.

In some aspects, the techniques described herein relate to a RF power generator wherein the plurality of inductances is three, and the demagnetizing circuit has an inner inductance, a middle inductance, and an outer inductance, wherein the inner inductance corresponds to an inner coil of an ICP chamber, the middle inductance corresponds to a middle coil of the ICP chamber, and the outer inductance corresponds to an outer coil of the ICP chamber.

In some aspects, the techniques described herein relate to a RF power generator including: a RF power source configured to generate an output signal; a power splitter configured to receive the output signal and generate a plurality of split signals; and a demagnetizing circuit configured to receive the plurality of split signals, the demagnetizing circuit configured to include a plurality of coils corresponding to the plurality of split signals, wherein the plurality of coils is configured to reduce the effects of mutual impedance of an ICP chamber in series with the plurality of inductances so that a ratio between a pair of the plurality of split signals varies substantially linearly as one of the pair of the plurality of split signals is varied.

In some aspects, the techniques described herein relate to a RF power generator wherein the demagnetizing circuit includes a plurality of outputs, the plurality of outputs corresponding to a respective one of a plurality of antennas of an ICP chamber, and a combined mutual inductance of the plurality of coils corresponding to the plurality of split signals is substantially equal to a combined mutual inductance of the plurality of antennas of the ICP chamber.

In some aspects, the techniques described herein relate to a RF power generator further including a matching network configured to receive the output signal from the RF power source and provide the output signal to the power splitter, the matching network configured to provide an impedance match with the RF power source.

In some aspects, the techniques described herein relate to a RF power generator wherein the demagnetizing circuit is positioned between the power splitter and a load.

In some aspects, the techniques described herein relate to a RF power generator wherein a load is positioned between the demagnetizing circuit and the power splitter.

In some aspects, the techniques described herein relate to a RF power generator wherein the plurality of coils is two, and the demagnetizing circuit has an inner coil and an outer coil, wherein the inner coil corresponds to an inner coil of an ICP chamber and the outer coil corresponds to an outer coil of the ICP chamber.

In some aspects, the techniques described herein relate to a RF power generator wherein the plurality of coils is three, and the demagnetizing circuit has an inner coil, a middle coil, and an outer coil, wherein the inner coil corresponds to an inner coil of an ICP chamber, the middle coil corresponds to a middle coil of the ICP chamber, and the outer coil corresponds to an outer coil of the ICP chamber.

In some aspects, the techniques described herein relate to a demagnetizing circuit for an ICP system including: a first inductance, the first inductance configured to receive a first RF signal, wherein the first inductance is electrically connected to a first antenna of an ICP chamber; and a second inductance, the second inductance configured to receive a second RF signal, wherein the second inductance is electrically connected to a second antenna of an ICP chamber; wherein the first inductance and the second inductance are configured to reduce the effects of mutual impedance of an ICP chamber in series with the plurality of inductances so that a ratio between the first RF signal and the second RF signal varies substantially linearly as one of the first RF signal or the second RF signal is varied.

In some aspects, the techniques described herein relate to a demagnetizing circuit for an ICP system wherein the first inductance may be may be one of a first coil having an inductance or a first induced inductance from conducting electrical current through a first electrical conductor and the second inductance may be may be one of a second coil having an inductance or a second induced inductance from conducting electrical current through a second electrical conductor.

In some aspects, the techniques described herein relate to a demagnetizing circuit for an ICP system wherein a combined mutual inductance of the first inductance and the second inductance is substantially equal to a combined mutual inductance of a first antenna and a second antenna of the ICP system.

In some aspects, the techniques described herein relate to a demagnetizing circuit for an ICP system wherein the demagnetizing circuit is positioned between a power splitter and a load.

In some aspects, the techniques described herein relate to a demagnetizing circuit for an ICP system wherein a load is positioned between the demagnetizing circuit and a power splitter.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
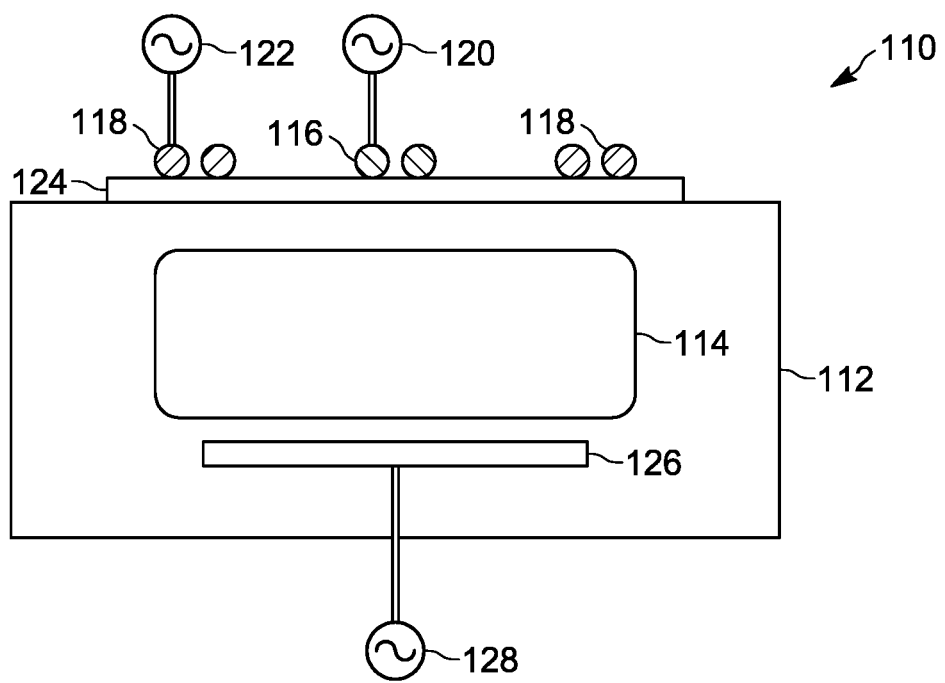
FIG. 1 shows a representation of an inductively coupled plasma system.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). Forward power may be maximized, and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by amplitude, frequency, and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020, and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

In a plasma processing system, plasma uniformity control is one important consideration to meet certain production yield requirements. Conductor etcher (or a poly etcher) is a type of ICP which uses selective dry etching on the wafer patterns. Conventional ICP etchers use multiple antenna coils separated from the vacuum space by a window which is a dielectric material enabling RF power penetration into the plasma chamber or reactor to ignite and sustain a plasma. The antenna coils are electrode structures that induce external electrical energy into the plasma generation space. Although antenna coils can assume various shapes and definitions depending on their structure, a typical ICP system has evolved from a single antenna to a double or multiple antenna coil shape. Such shapes may be used, for example, with 300 mm (approximately 12 inch) wafer processing.

Typical electrical energy supply and delivery methods for structures that use two or more antenna coils are powered from one electrical energy supply or power source, such as a RF generator operating in the kilohertz (kHz) to megahertz (MHz) frequency range, though other frequency ranges are also considered, in the semiconductor equipment industry. The frequency signal is typically applied to the plasma chamber or reactor via a matching network to match the load impedance and a power splitter which distributes power to the two or more antenna coils. The magnetic field generated by the current flowing through each antenna coil penetrates the plasma discharge space, and the induced electric field ionizes the space particles, resulting in plasma generation. The resultant plasma forms a local discharge space depending on the strength of the magnetic field, and the subsequent strength of the induced electric field, which is typically concentrated within a few to tens of Debye lengths. The plasma inducing radicals and ionized particles can diffuse to the entire discharge space.

The power splitter distributes adequate power to each antenna. It is usually a combination of variable capacitors and inductors in a series-parallel configuration. These electrical circuits are also called current splitter circuits because they control the current flow by adjusting the impedance of each antenna by varying additional variable capacitors and inductors inserted into the power splitter circuit. Consequently, by adjusting the current splitter, the ratio of current flowing to each antenna is controlled and the distribution of generated plasma. In various configurations, voltage can be split rather than current.

In conventional current splitting circuits, plasma distribution is not linearly controllable by the ratio of current flowing to each antenna. Since a plasma is a dielectric for the bulk plasma and the conductive medium for the plasma sheath is in contact with the boundaries, each antenna is coupled through each other and through the generated plasma because the antennas are not separated by an independent load. In addition, the plasma coupling also directly affects the driving electrical circuits, including the current splitter. Thus, the current ratio is not represented linearly. In other words, the current ratio is nonlinear when additional current must be applied to either antenna. Consequently, controlling the current ratio by varying an actuator in a region of having a sharp slope is less precise, resulting in a large plasma dispersion between chambers. Even if the current ratio is controlled and set through the current splitter, slight variations in plasma indicate differences between etching equipment, which leads to differences in quality of the semiconductor devices produced, ultimately affecting production yields.

Conventional approaches to matching networks for multi-coil ICP chambers do not address the non-linear interaction between RF currents. A first conventional approach controls the current to each antenna using capacitors connected in series to two branched antenna coils, and a second conventional approach controls the current to each antenna using capacitors configured in parallel to two branched antenna coils.

The first approach adjusts the current ratio in an ICP system using a variable capacitor in a splitting circuit in series with chamber impedance. A pair of inductors reduce current magnitude. However, the coupling of RF coils or coupling via the plasma are not considered. Further this first approach does not address the non-linear current ratio of RF currents. The second conventional approach to current ratio control uses one or more variable capacitors connected in parallel to RF coils. This second conventional approach does not address the non-linear characteristic of current ratio.

In the conventional ICP system described above, the mutual inductance between the two RF coils and/or the underlying characteristics of an ICP chamber or reactor, the currents in the RF coils interact. The interaction between the current results in a non-linear current ratio. The nonlinear current ratio between the RF currents makes plasma density control implemented by the control loop of current ratio controller complex.

A plasma processing system that does not consider non-linear interaction of RF currents inhibits consistently smooth current ratio control, increases the response time in the current ratio control loop, and increases overall impedance matching times of the system. It is desirable to reduce impedance matching times in a plasma processing system (for example, less than 500 microseconds using electronically variable capacitors). Improved response times of a current ratio control loop facilitates reducing impedance matching time of ICP systems.

This present disclosure describes using demagnetizing coils to increase linearity of current ratio between RF coils which help to increase controllability of plasma density or plasma uniformity of plasma processing systems.

FIG. 1 depicts a representation of an inductively coupled plasma (ICP) system 110. ICP system 110 includes a non-linear load, such as a reactor, plasma reactor, or plasma chamber 112, which will be referred to interchangeably herein, to generate plasma 114. Power in the form of voltage or current is applied to plasma chamber 112 via a pair of coils, including a coil assembly that in various embodiments includes an inner coil 116 and an outer coil 118. Power is applied to inner coil 116 via a RF power generator or power source 120, and power is applied to outer coil 118 via RF power generator or power source 122. Coils 116 and 118 are mounted to dielectric window 124 that assists in coupling power to plasma chamber 112. A substrate 126 is placed in plasma chamber 112 and typically forms the work piece that is the subject of plasma operations. An RF power generator, power supply, or power source 128 (the terms may be used herein interchangeably) applies power to plasma chamber 112 via substrate 126. In various configurations, the power sources 120, 122 provide a source voltage or current to ignite or generate plasma 114 or control the plasma density. Also in various configurations, power source 128 provides a bias voltage or current that modulates the ions to control the ion energy or ion density of the plasma 114. In various embodiments, power sources 120, 122 are locked to operate at the same frequency, voltage, and current, with fixed or varying relative phases. In various other embodiments, power sources 120, 122 may operate at different frequencies, voltages, and currents, and relative phases.

Figure 2:
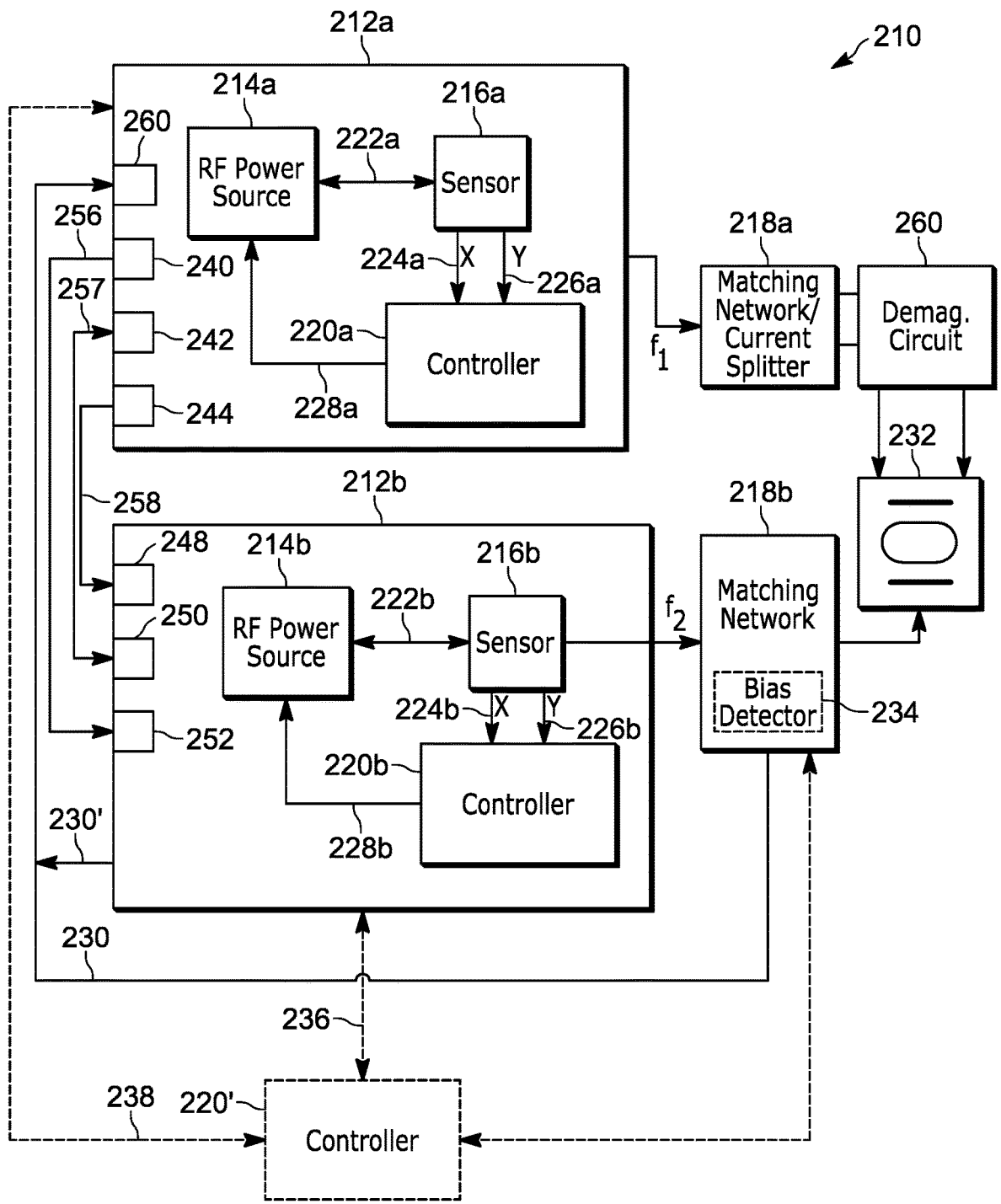
FIG. 2 is a schematic diagram of a power delivery system having multiple power supplies arranged according to the present disclosure.

FIG. 2 depicts a RF generator or power supply system 210. Power supply system 210 includes a pair of radio frequency (RF) generators or power supplies 212a, 212b, matching networks 218a, 218b, and load 232, such as a non-linear load, which may be a plasma chamber, process chamber, and the like. In various embodiments, RF generator 212a is referred to as a source RF generator or power supply, and matching network 218a is referred to as a source matching network. Also in various embodiments, RF generator 212b is referred to as a bias RF generator or power supply, and matching network 218b is referred to as a bias matching network. It will be understood that the components can be referenced individually or collectively using the reference number without a letter subscript or a prime symbol.

In various embodiments, source RF generator 212a receives a control signal 230 from matching network 218b, generator 212b, or a control signal 230' from bias RF generator 212b. As will be explained in greater detail, control signal 230 or 230' represents an input signal to source RF generator 212a that indicates one or more operating characteristics or parameters of bias RF generator 212b. In various embodiments, a synchronization bias detector 234 senses the RF signal output from matching network 218b to load 232 and outputs a synchronization or trigger signal 230 to source RF generator 212a. In various embodiments, synchronization or trigger signal 230' may be output from bias RF generator 212b to source RF generator 212a, rather than trigger signal 230. A difference between trigger or synchronization signals 230, 230' may result from the effect of matching network 218b, which can adjust the phase between the input signal to and output signal from matching network. Signals 230, 230' include information about the operation of bias RF generator 212b that in various embodiments enables predictive responsiveness to address periodic fluctuations in the impedance of plasma chamber or load 232 caused by the bias RF generator 212b. When control signals 230 or 230' are absent, RF generators 212a, 212b operate autonomously.

RF generators 212a, 212b include respective RF power sources or amplifiers 214a, 214b, RF sensors 216a, 216b, and processors, controllers, or control modules 220a, 220b. RF power sources 214a, 214b generate respective RF power signals 222a, 222b output to respective sensors 216a, 216b. Sensors 216a, 216b receive the output of RF power sources 214a, 214b and generate respective RF power signals $f_1$, $f_2$. Sensors 216a, 216b also output signals that vary in accordance with various parameters sensed from load 232. While sensors 216a, 216b, are shown within respective RF generators 212a, 212b, RF sensors 216a, 216b can be located externally to the RF power generators 212a, 212b. Such external sensing can occur at the output of the RF generator, at the input of an impedance matching device located between the RF generator and the load, or between the output of the impedance matching device (including within the impedance matching device) and the load.

Sensors 216a, 216b detect various operating parameters and output signals X and Y. Sensors 216a, 216b may include voltage, current, and/or directional coupler sensors. Sensors 216a, 216b may detect (i) voltage V and current I and/or (ii) forward power $P_{FWD}$ output from respective power amplifiers 214a, 214b and/or RF generators 212a, 212b and reverse or reflected power $P_{REV}$ received from respective matching network 218a, 218b or load 232 connected to respective sensors 216a, 216b. The voltage V, current I, forward power $P_{FWD}$, and reverse power $P_{REV}$ may be scaled, filtered, or scaled and filtered versions of the actual voltage, current, forward power, and reverse power associated with the respective power sources 214a, 214b. Sensors 216a, 216b may be analog or digital sensors or a combination thereof. In a digital implementation, the sensors 216a, 216b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 216a, 216b generate sensor signals X, Y, which are received by respective controllers or power control modules 220a, 220b. Power control modules 220a, 220b process the respective X, Y signals 224a, 226a and 224b, 226b and generate one or a plurality of feedforward or feedback control signals 228a, 228b to respective power sources 214a, 214b. Power sources 214a, 214b adjust the RF power signals 222a, 222b based on received the one or plurality feedback or feedforward control signal. In various embodiments, power control modules 220a, 220b may control matching networks 218a, 218b, respectively, via respective control signals 221a, 221b. Power control modules 220a, 220b may include, at least, proportional integral derivative (PID) controllers or subsets thereof and/or direct digital synthesis (DDS) component(s) and/or any of the various components described below in connection with the modules.

In various embodiments, power control modules 220a, 220b are PID controllers or subsets thereof and may include functions, processes, processors, or submodules. Control signals 228a, 228b may be drive signals and may include DC offset or rail voltage, voltage or current magnitude, frequency, and phase components. In various embodiments, feedback control signals 228a, 228b can be used as inputs to one or multiple control loops. In various embodiments, the multiple control loops can include a proportional-integral-derivative (PID) control loop for RF drive, and for rail voltage. In various embodiments, control signals 228a, 228b can be used in a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other embodiments, signals 228a, 228b can provide feedforward control as described in U.S. Pat. No. 10,049,857, assigned to the assignee of the present application and incorporated by reference herein.

In various embodiments, power supply system 210 can include controller 220'. Controller 220' may be disposed externally to either or both of RF generators 212a, 212b and may be referred to as external or common controller 220'. In various embodiments, controller 220' may implement one or a plurality of functions, processes, or algorithms described herein with respect to one or both of controllers 220a, 220b. Accordingly, controller 220' communicates with respective RF generators 212a, 212b via a pair of respective links 236, 238 which enable exchange of data and control signals, as appropriate, between controller 220' and RF generators 212a, 212b. For the various embodiments, controllers 220a, 220b, 220' can distributively and cooperatively provide analysis and control along with RF generators 212a, 212b. In various other embodiments, controller 220' can provide control of RF generators 212a, 212b, eliminating the need for the respective local controllers 220a, 220b.

In various embodiments, RF power source 214a, sensor 216a, controller 220a, and matching network 218a can be referred to as source RF power source 214a, source sensor 216a, source controller 220a, and source matching network 218a. Similarly in various embodiments, RF power source 214b, sensor 216b, controller 220b, and matching network 218b can be referred to as bias RF power source 214b, bias sensor 216b, bias controller 220b, and bias matching network 218b. In various embodiments and as described above, the source term refers to the RF generator that generates a plasma, and the bias term refers to the RF generator that tunes the plasma Ion Energy Distribution Function (IEDF). In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

According to various embodiments, source RF generator 212a and bias RF generator 212b include multiple ports to communicate externally. Source RF generator 212a includes a pulse synchronization output port 240, a digital communication port 242, and an RF output port 244. Bias RF generator 212b includes an RF input port 248, a digital communication port 250, and a pulse synchronization input port 252. Pulse synchronization output port 240 outputs a pulse synchronization signal 256 to pulse synchronization input port 252 of bias RF generator 212b. Digital communication port 242 of source RF generator 212a and digital communication port 250 of bias RF generator 212b communicate via a digital communication link 257. RF output port 244 generates a RF control signal 258 input to RF input port 248. In various embodiments, RF control signal 258 is substantially the same as the RF control signal controlling source RF generator 212a. In various other embodiments, RF control signal 258 is the same as the RF control signal controlling source RF generator 212a, but is phase shifted within source RF generator 212a in accordance with a requested phase shift generated by bias RF generator 212b. Thus, in various embodiments, source RF generator 212a and bias RF generator 212b are driven by substantially identical RF control signals or by substantially identical RF control signal phase shifted by a predetermined amount.

In various configurations, one or both of matching networks 218a, 218b may be configured as a combination of a matching network and a current splitter as shown at matching network/current splitter 218a. Matching network/current splitter 218a performs at least two functions. A first function is conventional impedance matching. A second function is splitting the incoming RF power signal $f_1$ into one or more outputs applied to respective coils ICP coils, such as coils 116, 118 of FIG. 1, of load 232. Splitting incoming RF power signal $f_1$ into one or more outputs enables varying the power applied to respective coils 116, 118. In various configurations, the RF output power signal may be split between coils 116, 118 of FIG. 1 using a ratioed approach. Power is split to provide a desired ratio between power applied to one of coils 116, 118 and the other of coils 116, 118. In various configurations, and throughout this specification, the matching network and current splitter of matching network/current splitter 218a may be integrated units, separate units, or distributed across one or multiple components.

As shown in FIG. 2, the pair of RF power signals output by matching network/current splitter 218a is input to demagnetizing circuit 260. As will be described in greater detail herein, demagnetizing circuit 260 includes inductive components that receive the RF power signals output from matching network/current splitter 218a that generates mutual coupling. The mutual coupling is configured to substantially cancel the mutual coupling at coils 116, 118, as shown in FIG. 1. It will be understood that the configuration of matching network/current splitter 218a may be implemented in one or both of matching networks 218a, 218b.

Figure 3:
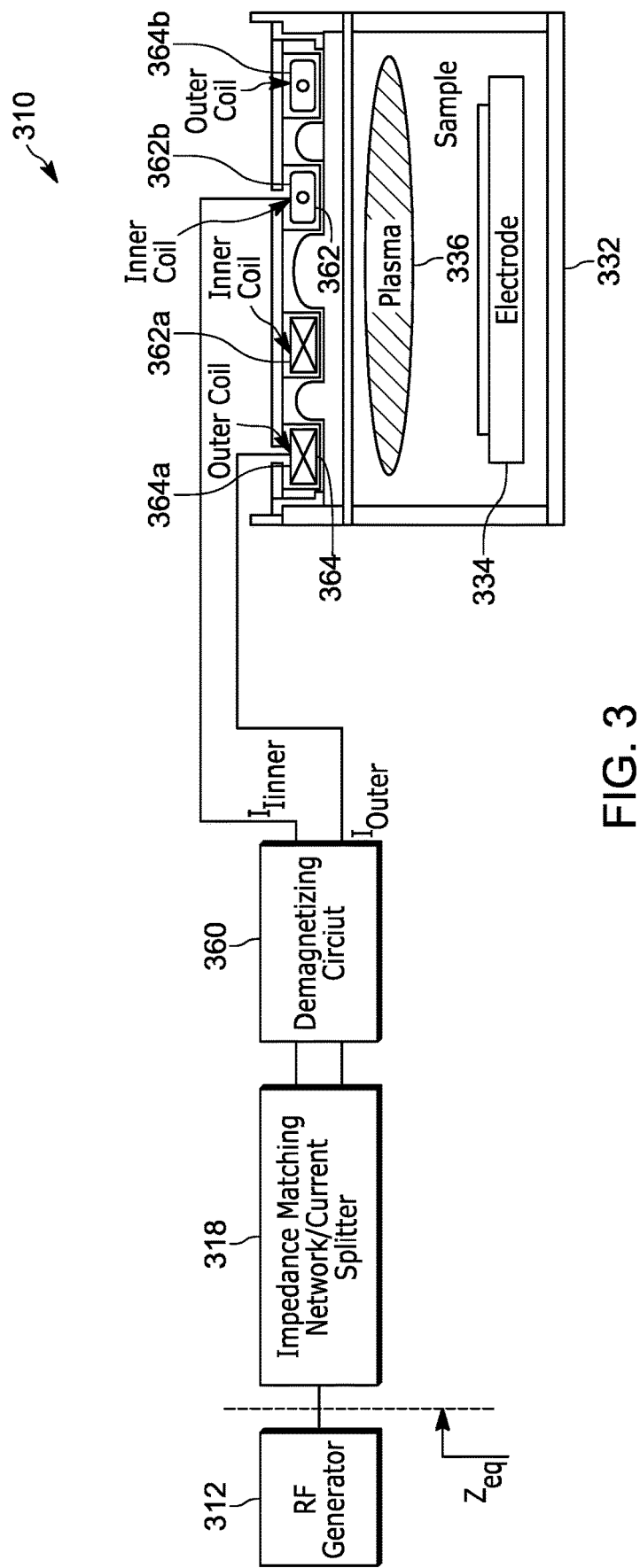
FIG. 3 shows a portion of a RF power delivery system using demagnetizing coils according to the present disclosure.

As will be described in detail in the following figures, the present disclosure discloses demagnetizing coils in series with the ICP chamber to increase linearity of the current ratio of the RF coils and controllability of plasma density or plasma uniformity in a plasma processing system. FIG. 3 shows a block diagram of a plasma system 310 including a demagnetizing circuit according to the present disclosure. RF generator 312 generates an RF output applied to impedance matching network/current splitter 318. Impedance matching network/current splitter 318 operates similarly as described above with respect to FIG. 2. Impedance matching network/current splitter 318 generates a pair of outputs or split signals to demagnetizing circuit 360. Demagnetizing circuit 360 includes demagnetizing coils to generate an induced magnetic field counter to the magnetic field inducted the inner coil and outer coil in an ICP configuration. Demagnetizing circuit 360 generates a pair of RF power signals, and one of the pair is applied to one of a pair of terminals 362a, 362b of inner coil 362, and the other of the pair is applied to one of a pair of terminals 364a, 364b of outer coil 364. The impedance at the output of RF generator 312 is represented by an equivalent impedance $Z_{eq}$ and represents the impedance resulting from the equivalent impedance of components including impedance matching network/current splitter 318, demagnetizing circuit 360, and plasma chamber or load 332.

Plasma chamber or load 332 is energized by the RF signals applied to each of inner coil 362 and outer coil 364. Electrode 334 may be grounded or powered via a second RF generator (not shown in FIG. 3) which applies power via an ICP or CCP configuration. The application of power to plasma chamber or load 332 generates plasma 336 interior to plasma chamber or load 332. Plasma 336 enables the application of various manufacturing and fabrication processes.

Figure 4:
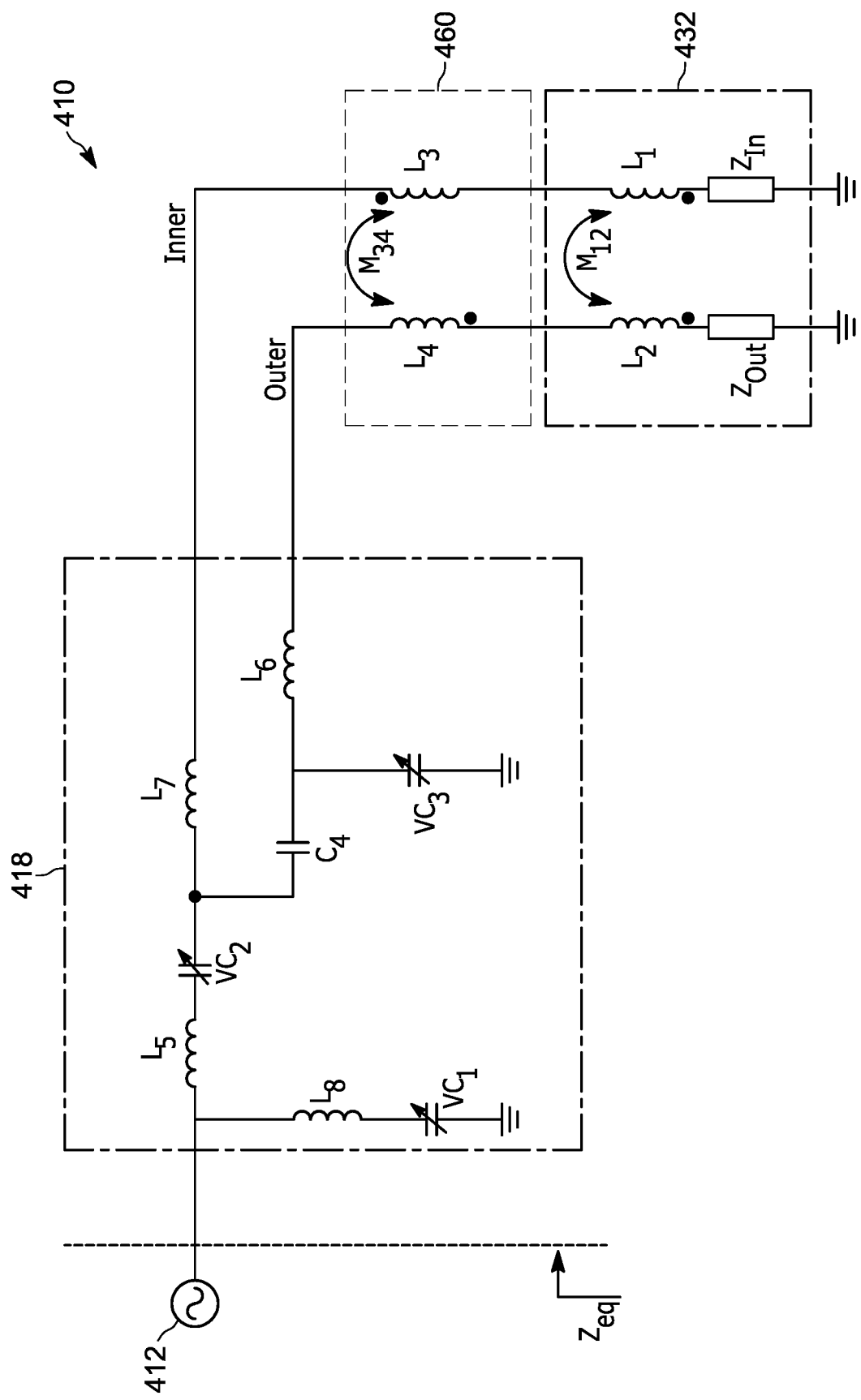
FIG. 4 shows a circuit diagram of a RF power delivery system using demagnetizing coils according to the present disclosure.

FIG. 4 depicts a circuit diagram of 410 of portions of the power delivery systems arranged in accordance with the present disclosure. RF power supply or power source 412 outputs a RF signal to an equivalent impedance $Z_{eq}$ including matching network/current splitter 418, demagnetizing circuit 460, and plasma chamber or load 432. The matching network portion of matching network/current splitter 418 includes inductor $L_8$ in series with variable capacitor $V_{C1}$, both of which are in parallel with inductor $L_5$ in series with variable capacitor $V_{C2}$. Inductor $L_8$ and variable capacitor $V_{C1}$ form a shunt leg of the matching network, and inductor $L_5$ and variable capacitor $V_{C2}$ form a series leg of the matching network. Current splitting is carried out by the circuit formed by inductor $L_7$ in parallel with capacitor $C_4$ and inductor $L_6$. Variable capacitor $V_{C3}$ provides a shunt to ground and connects between capacitor $C_4$ and inductor $L_6$. Varying the capacitance of $V_{C3}$ varies the current ratio between the RF power applied to inner and outer coils.

Matching network/current splitter 418 is shown using a L-type matching circuit. Other matching circuits may be used, including T-type or π-types matching circuits or their combinations thereof that control total impedance $Z_{eq}$ seen by a RF generator and the current ratio between RF coils $L_1$, $L_2$. Variable capacitors $V_{C1}$, $V_{C2}$ are varied to provide an impedance to reduce reflected power to the RF power source 412, thereby increasing forward power applied to plasma chamber or load 432. A power ratio between inner coil $L_1$ and outer coil $L_2$ that adjusts plasma density at inner and outer regions of plasma chamber or load 432 is controlled by total forward power sent from a RF power source 412 and the current ratio between inner coil $L_1$ and outer coil $L_2$. In one non-limiting example, a target power of inner coil $L_1$ and outer coil $L_2$ is 1,000 W, and 500 W, respectively. In such a configuration, a system controller controls a total forward power of 1,500 W from RF power source 412 to plasma chamber or load 432, and a current ratio of inner coil $L_1$ and outer coil $L_2$ is controlled to 2:1. As noted above, current splitting circuit of the matching network uses a shunt variable capacitor $V_{C3}$, but is not limited to other configuration to control the current ratio of the RF coils.

Matching network/current splitter 418 outputs a pair of RF power signals applied to respective inner coil or inductor $L_3$ and outer coil or inductor $L_4$ of demagnetizing circuit 460. Demagnetizing circuit 460 thus outputs a plurality of signals. As will be described further herein, the plurality may be two, three, or more split signals. Inner coil $L_3$ and outer coil $L_4$ output RF power signals to respective inner antenna, inductor, or coil $L_1$ and outer antenna, inductor, or coil $L_2$ of plasma chamber or load 432. Inner coil $L_1$ and outer coil $L_2$ connect to ground via respective impedances $Z_{in}$ and $Z_{out}$, which represent impedances in plasma chamber or load 432.

As shown in FIG. 4, inner coil $L_3$ and outer coil $L_4$ are represented as inductors formed by coils. However, inner coil $L_3$ and outer coil $L_4$, in various configurations, represent inductances that interact to generate mutual inductances $M_{34}$ that substantially cancel or offset the mutual inductances generated by inner coil or inductor $L_1$ and outer coil or inductor $L_2$ in the ICP chamber or load 432. Thus, $L_3$ and $L_4$ may also refer to inductances and such inductances may be induced rather than generated through inductive coils.

The equivalent circuit of the ICP chamber or load 432 includes self-inductances, $L_1$ and $L_2$ of the RF coils, mutual inductance of the RF coils $M_{12}$, and two equivalent impedances $Z_{in}$ and $Z_{Out}$ of the chamber. Inner $L_1$ and outer coil $L_2$ connect to ground via respective impedances $Z_{in}$ and $Z_{out}$. The mutual inductance $M_{12}$ represents a coupling impedance or mutual impedance produced by two RF coils and/or chamber plasma.

Demagnetizing circuit 460 includes demagnetizing coils $L_3$ and $L_4$ in series with an ICP connected plasma chamber or load 432. The current ratio CR between inner and outer RF coils is described by Equation (1)

$$CR = \frac{I_{1RMS}}{I_{2RMS}} = \left| \frac{Z_{C4} - Z_M}{Z_{Si}} + \frac{Z_{C4} - Z_M}{Z_{si}} \cdot \frac{\frac{Z_M}{Z_{Si}} + \frac{Z_{So}}{Z_{C4} - Z_M}}{x - \frac{Z_M}{Z_{Si}}} \right| \quad (1)$$

Where:

$$x = \frac{Z_{C3}}{Z_{C3} + Z_{C4}}$$

$$Z_M = Z_{M12} + Z_{M34}$$
$$Z_{Si} = Z_{In} + Z_{L1} + Z_{L3} + Z_{L7}$$
$$Z_{So} = Z_{Out} + Z_{L2} + Z_{L4} + Z_{L6}$$

Where:
$Z_M$ is the total coupling impedance or mutual impedance;
$Z_{Si}$ is self-impedance of the inner path seen from the current splitter; and
$Z_{So}$ is the self-impedance of the outer path seen from the current splitter.
Where:
$I_{aRMS}$ is the root-mean-square current through coil a;
$Z_{Mij}$ is the coupling impedance or mutual impedance between coils i and j;
$Z_{Ck}$ is the impedance of capacitor k; and
$Z_{Ln}$ is the impedance of inductor n.

From the above, it can be shown that current ratio becomes linear under one of the following conditions:

$$x - \frac{Z_M}{Z_{Si}} \approx x \text{ or } \frac{Z_M}{Z_{Si}} \approx 0$$

The dynamic chamber impedance seen from inner path includes three components ($Z_{In}$, $Z_{L1}$, $Z_{M12}$), and the dynamic chamber impedance seen from outer path includes three components ($Z_{Out}$, $Z_{L2}$, $Z_{M12}$). Accordingly:

$Z_{In}$ is the dynamic chamber impedance seen from inner path, excluding $Z_{L1}$ and $Z_{M12}$; and
$Z_{Out}$ is the dynamic chamber impedance seen from outer path, excluding $Z_{L2}$ and $Z_{M12}$.

In the circuit of FIG. 4, demagnetizing circuit 460 includes demagnetization coils that adjust the ratio $$\frac{Z_M}{Z_{Si}}$$

of Equation (1) to be equal or nearly equal to zero to provide the linearity of the current ratio between RF coils, such as inner coil $L_1$ and outer coil $L_2$. The demagnetizing coils described herein may be implemented using mutual inductance compensation or mutual inductance suppression. In the mutual inductance compensation method, the goal is to drive $Z_M$ to zero. In the mutual inductance suppression method, the goal is for $Z_{Si}$ to be more than 10 times $Z_M$ to reduce $$\frac{Z_M}{Z_{Si}}$$

to maze the term less significant to reduce non-linearity.

In the mutual inductance compensation approach, self-inductances $L_3$ and $L_4$ of the demagnetizing circuit 460 can either have the same or different self-inductances as coils $L_1$, $L_2$. The mutual inductance $M_{34}$ of demagnetizing coils $L_3$ and $L_4$ should be substantially equal to magnitude of mutual inductance $M_{12}$ of coils $L_1$ and $L_2$, which represents a complex coupling between RF coils and/or plasmas of the chamber. The direction between the mutual inductances $M_{12}$ and $M_{34}$ is opposite. The interaction between two inner and outer currents represented by the mutual inductance $M_{12}$ of the chamber via coils $L_1$ and $L_2$ is substantially cancelled by the mutual inductance $M_{34}$ of demagnetizing coils $L_3$ and $L_4$. Substantial cancellation renders current ratio of the RF coils $L_1$ and $L_2$ substantially linear. Inductors $L_6$ and $L_7$ in the matching network/current splitter 418 of FIG. 6 can be merged into the inductors $L_4$ and $L_3$ of demagnetizing circuit 460 to reduces size, cost, or assembly matching network/current splitter 418.

In the mutual inductance suppression approach, it does not matter whether the mutual inductance $M_{34}$ of the demagnetizing inner coil $L_3$ and outer coil $L_4$ is zero ($M_{34}=0$) or non_zero ($M_{34}\neq 0$). The self-inductance of inner demagnetizing coil $L_3$ and outer demagnetizing coil $L_4$, or total self-inductance of inner path ($L_3$ and $L_7$) and outer paths ($L_4$ and $L_6$) are designed to be much larger than total mutual inductance ($M_{12}+M_{34}$). In such a configuration, non-linear interaction between RF current coils has less impact, and the current ratio becomes more linear.

Figure 5:
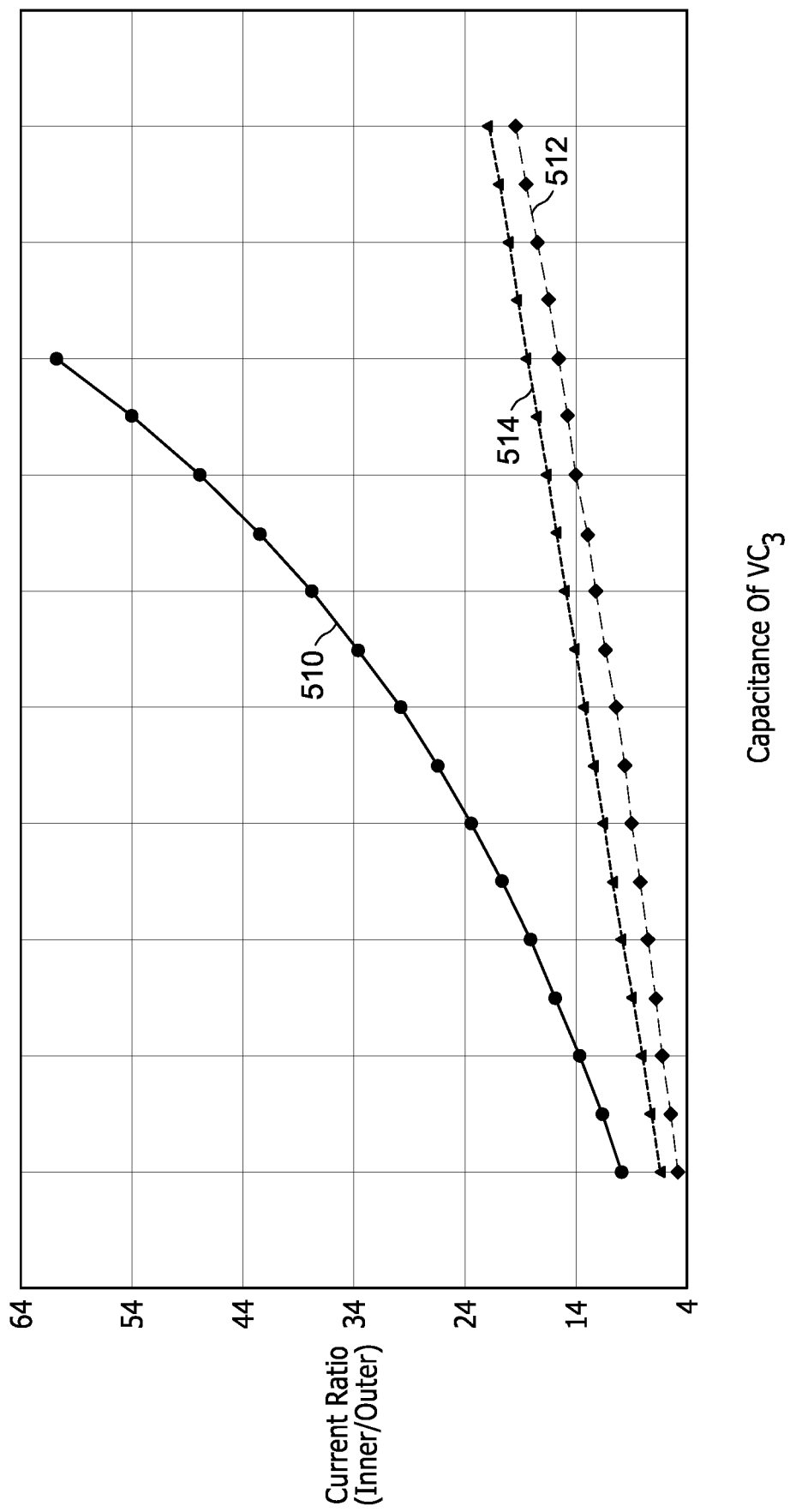
FIG. 5 shows waveforms of a RF power delivery system operated with and without demagnetizing coils.

FIG. 5 shows plots current ratio versus capacitance between two RF coils of an ICP chamber with and without demagnetizing coils. The x-axis represents the value of variable capacitor $V_{C3}$ versus the current ration of the RF power applied to inner coil $L_1$ and outer coil $L_2$. Plot 510 indicates the current ratio of a conventional system that does not employ the demagnetizing circuit of the present disclosure. As can be seen, plot 510 presents a nonlinear configuration.

Plot 512 shows the current ratio using a mutual inductance suppression approach. For plot 512, mutual inductance $M_{34}$ is zero, while mutual inductance $M_{12}$ is other than zero. The total self-inductance $Z_{Si}$ of inner and outer circuits is about five times larger than the mutual inductance $Z_M$, which is representative for complicated coupling of ICP chamber. Plot 514 shows the current ratio using a mutual inductance compensation approach. In the mutual inductance compensation approach, mutual inductance $M_{34}$ of inner demagnetizing coil $L_3$ and outer demagnetizing coil $L_4$ has the same amplitude but opposite polarity of mutual inductance $M_{12}$ of inner coil $L_1$ and outer coil $L_2$ for powering plasma chamber or load 432 in an ICP configuration. Both mutual inductance compensation approach shown in in plot 514 and mutual inductance suppression approach shown in plot 512 can improve the linearity of the current ratio of the RF coils of the ICP chamber.

Figure 6:
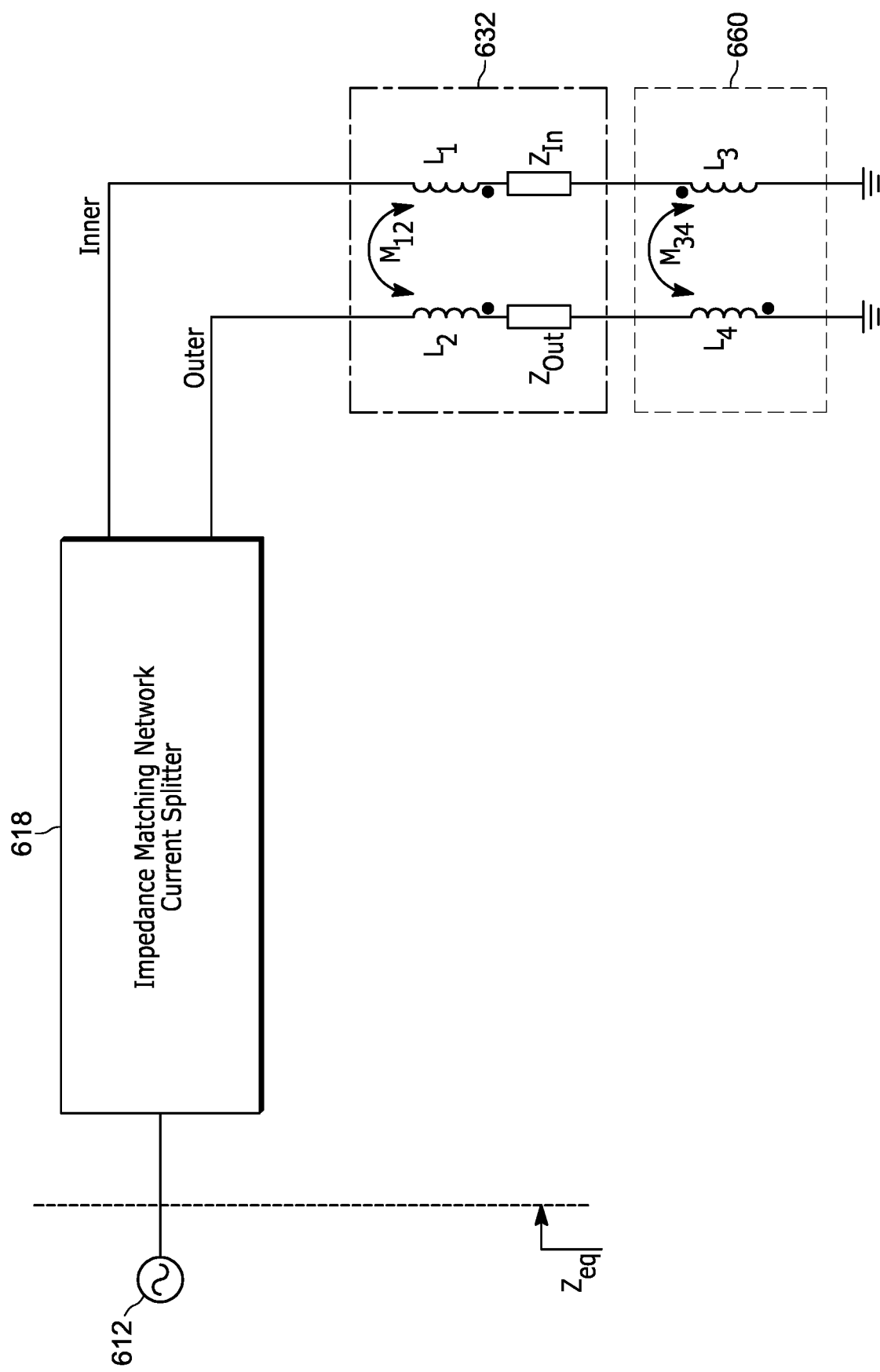
FIG. 6 shows a demagnetizing circuit with the demagnetizing coils located in a different position relative to the load according to the present disclosure.

FIG. 6 shows a circuit diagram of 610 of portions of the power delivery systems arranged in accordance with the present disclosure. The configuration of FIG. 6 is similar to the configuration of FIG. 4, but the demagnetizing circuit 660 is placed opposite the impedance matching network/current splitter 618 from the plasma chamber or load 632. RF power supply 612 outputs a RF signal to an equivalent impedance $Z_{eq}$ including matching network/current splitter 618, demagnetizing circuit 660, and plasma chamber or load 632. The components of FIG. 6 operate similarly to the components of FIG. 4, with the demagnetizing circuit 660 and plasma chamber or load 632 positioned in opposite locations within the circuit. The circuits of FIG. 4 and FIG. 6 operate similarly in that both circuits enable a linear current ratio between RF power applied to the inner coil and the outer coil.

Figure 7:
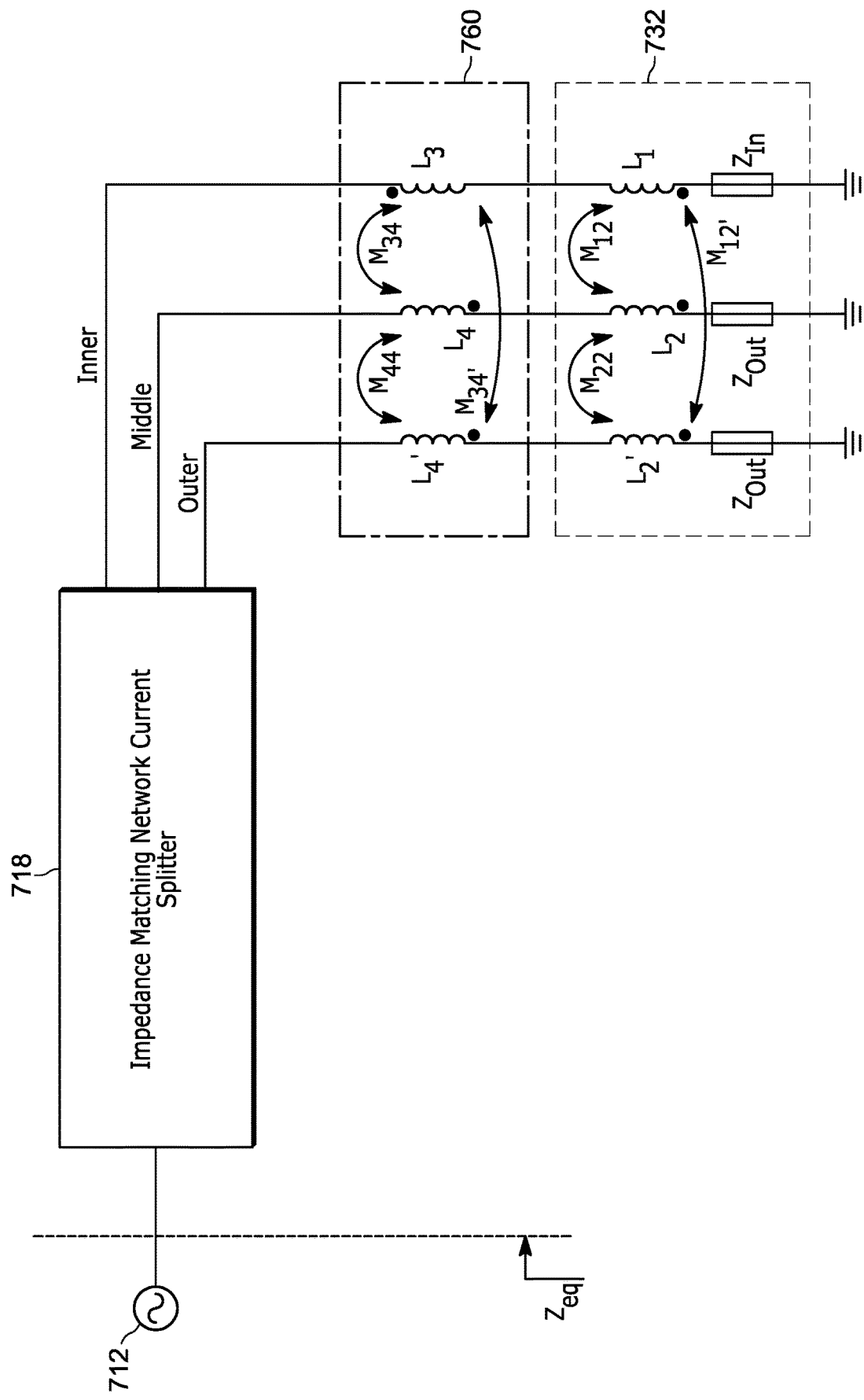
FIG. 7 shows a demagnetizing circuit with more than two demagnetizing coils according to the present disclosure.

FIG. 7 shows a circuit diagram of 610 of portions of the power delivery systems arranged in accordance with the present disclosure. The configuration of FIG. 7 is similar to the configurations of FIG. 4 or FIG. 6, but three coils provide an ICP connection between impedance matching network/current splitter 718 and plasma chamber or load 732 occurs using an ICP connection with three coils. The three ICP coils comprise inner coil $L_1$, middle coil $L_2$, and outer coil $L_2'$. Demagnetizing circuit 760 includes a trio of coils, including inner coil $L_3$, middle coil $L_4$, and outer coil $L_4'$, which correspond to respective inner coil $L_1$, middle coil $L_2$, and outer coil $L_2'$. Demagnetizing circuit 760 includes three mutual inductances $M_{34}$, $M_{44}$, and $M_{34'}$ to compensate for respective mutual inductances $M_{12}$, $M_{22}$, and $M_{12'}$ of the RF coils in the chamber. In such a configuration, Equation (1) may be adjusted to consider the additional terms introduced by addition of a third coil.

Similarly, to FIG. 6, in various configurations, demagnetizing circuit 760 of FIG. 7 may be positioned opposite the impedance matching network/current splitter 718 from the plasma chamber or load 732. That is, the plasma chamber or load 732 is positioned between matching network/current splitter 718 and demagnetizing circuit 760. In either configuration, demagnetizing circuit 760 placed before plasma chamber or load, or plasma chamber or load 732 placed before demagnetizing circuit 760, the circuit FIG. 7 operates to provide a linear current ratio between RF power applied to the three coils or inductances, inner coil or inductance L1, middle coil or inductance L2, and outer coil or inductance L2'.

Figure 8:
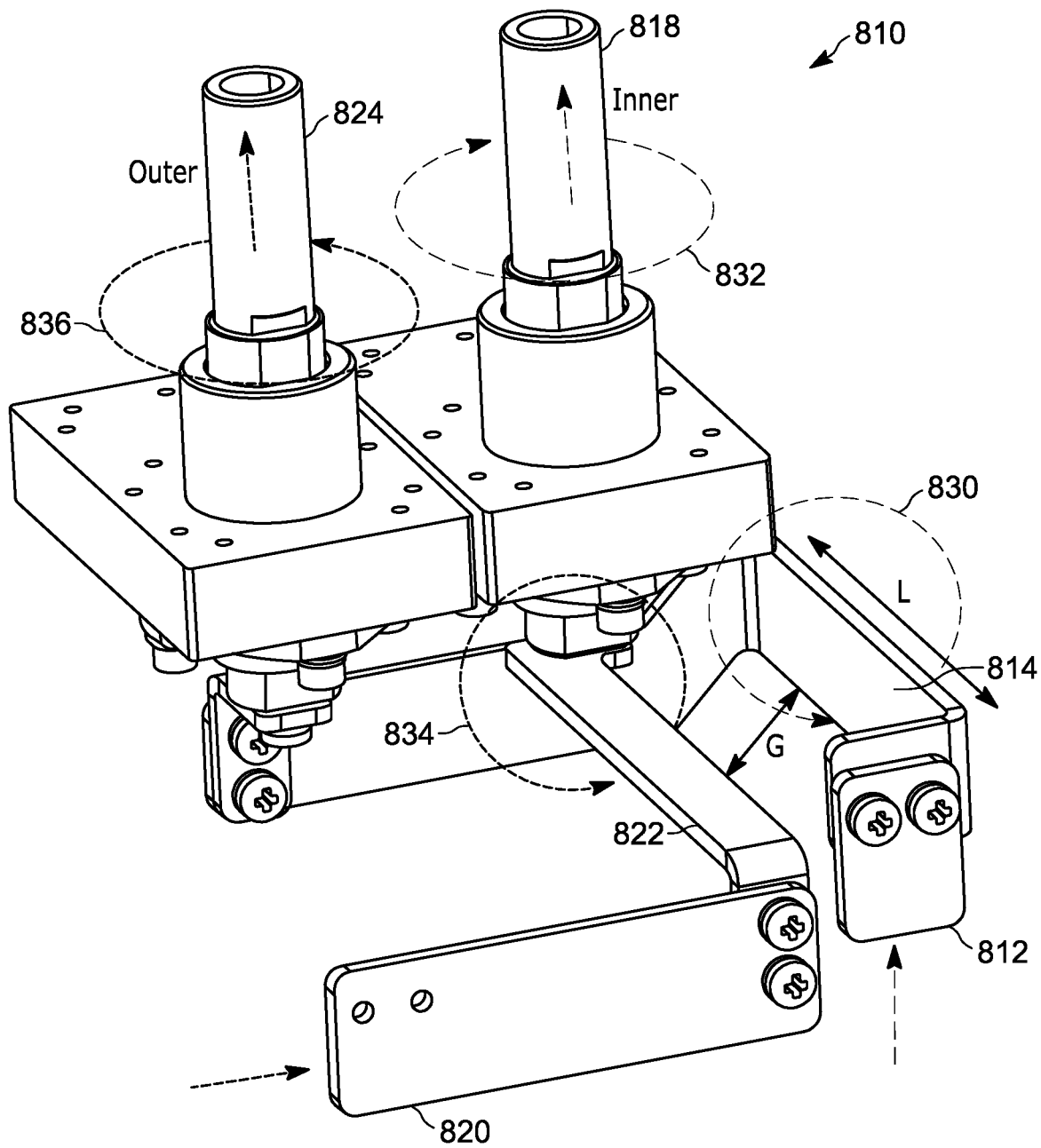
FIG. 8 shows a bus bar arranged to provide a demagnetizing coil configuration according to the present disclosure.
Figure 9:
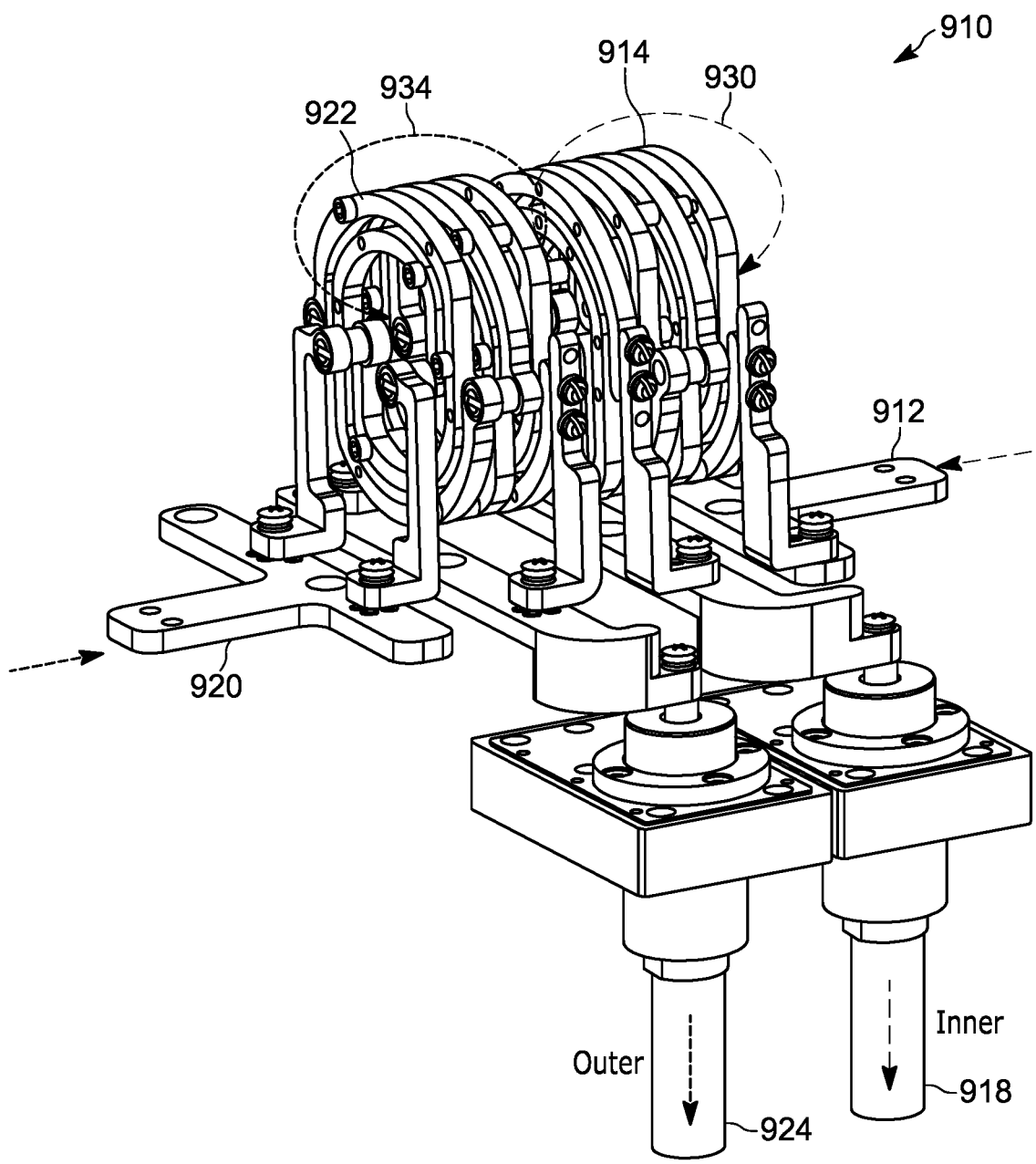
FIG. 9 shows a bus bar arranged to provide a demagnetizing coil configuration according to the present disclosure.

FIGS. 8 and 9 show various demagnetizing circuit configurations arranged according to the present disclosure. In FIG. 8, demagnetizing circuit 810 show a busbar including connectors arranged to correspond to correspond to inner coil $L_3$ and outer coil $L_4$, respectively. Power is provided to inner demagnetizing coil $L_3$ via terminal or connector 812 and flows through conductor or electrical conductor 814 to terminal or connector 818. Terminal or connector 818 connects to the ICP outer coil $L_1$ of a plasma chamber or load, such as plasma chamber or load 432, 632, or 732. Similarly, power is provided to demagnetizing outer coil $L_4$ via terminal or connector 820 and flows through electrical conductor 822 to terminal or connector 824. Terminal or connector 824 connects to ICP outer coil $L_2$ of a plasma chamber or load, such as plasma chamber or load 432, 632, or 732.

Current or power flowing through electrical conductor 814 generates flux 830, and the same current flowing through inner coil $L_1$ generates flux 832. Flux 830 and flux 832 are considered mutual flux and have opposite polarities to provide a demagnetizing effect. Similarly, current or power flowing through electrical conductor 822 generates flux 834, and the same current flowing through outer coil $L_2$ generates flux 836. Flux 834 and flux 836 are considered mutual flux and have opposite polarities to provide a demagnetizing effect. By proper selection of the length of L of electrical conductors 814, 822 and the gap G between electrical conductors 814, 822, the respective flux 830, 834 can be tuned to substantially cancel respective flux 832, 836. Thus, demagnetizing circuit 810 can be provided by selective structuring the dimensions of the busbar shown in FIG. 8.

In FIG. 9, demagnetizing circuit 910 shows a busbar formed to include inner demagnetizing coil $L_3$ and outer demagnetizing coil $L_4$, respectively. Power is provided to inner demagnetizing coil $L_3$ via a terminal or connector 912 and flows through demagnetizing inner coil 914 ($L_3$) to terminal or connector 918. Terminal or connector 918 connects to the ICP outer coil $L_1$ of plasma chamber or load, such as plasma chamber or load 432, 632, or 732. Similarly, power is provided to demagnetizing outer coil $L_4$ via terminal or connector 920 and flows through demagnetizing outer coil 922 ($L_4$) to terminal or connector 924. Terminal or connector 924 connects to ICP outer coil $L_2$ of plasma chamber or load, such as plasma chamber or load 432, 632, or 732.

Current or power flowing through demagnetizing inner coil 914 generates flux 930, and the same current flowing through inner coil $L_1$ generates flux (not shown). Flux of inner coil $L_1$ and flux 930 are considered mutual flux and have opposite polarities to provide a demagnetizing effect. Similarly, current or power flowing through demagnetizing outer coil 922 generates flux 934, and the same current flowing through outer coil $L_2$ generates flux (not shown). Flux of outer coil $L_2$ and flux 934 are considered mutual flux and have opposite polarities to provide a demagnetizing effect.

The subject disclosure may, but need not, provide one or more of the following benefits. The demagnetizing coils compensate or suppress effects of mutual inductance between the RF coils of a plasma processing system. By using the disclosed demagnetizing coils, a non-linear current ratio between inner and outer RF ICP coils becomes linear which reduces the response time, increases accuracy, and smoothness of the current ratio control loop. In operation, a matching control loop is completed after a current ratio control loop. Therefore, improvement of current ratio control loop reduces impedance matching time of a matching network. The position of demagnetizing coils and impedance matching networks are flexible. The invention includes, but is not limited to, two RF coils or multiple ICP coils or antennas for plasma chambers. The demagnetizing coils include, but are not limited, common RF coils, busbars, microstrip, or strip line. Various benefits include improvements in efficiency and quality of the etching process, and maintenance and repair time are reduced Plasma etch customers can benefit from using demagnetizing coils that improve linearly of current ratios between RF coils of ICP chambers, but the demagnetizing coils described herein may, but need not, provide other benefits. ICP chambers used for etching include multiple RF coils and require controlling current ratio between those RF coils to improve controllability of plasma uniformity. Such a configuration includes process requirement of sufficient impedance matching times and control loop accuracy. A non-linear relationship between RF coils and/or plasma of the ICP chambers limits response time, accuracy, and matching speed of the system. Further, current ratio control in systems having a non-linear slope is less precise, resulting in large plasma dispersion between chambers. The proposed demagnetizing coils disclosed herein can improve linearity of the current ratio between the RF coils which help to increase speed and accuracy of control loops of the ICP chamber systems.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A RF power generator comprising:
a RF power source configured to generate an output signal;
a power splitter configured to receive the output signal and generate a plurality of split signals; and
a demagnetizing circuit configured to receive the plurality of split signals, the demagnetizing circuit configured to include a plurality of inductances corresponding to the plurality of split signals,
wherein the plurality of inductances is configured to reduce the effects of mutual impedance of an inductively coupled plasma (ICP) chamber in series with the plurality of inductances so that a current ratio between a pair of the plurality of split signals varies substantially linearly as one of the pair of the plurality of split signals is varied.

2. The RF power generator of claim 1 wherein the plurality of inductances may be one of a coil having an inductance or an induced inductance from conducting electrical current through an electrical conductor.

3. The RF power generator of claim 1 wherein the demagnetizing circuit includes a plurality of outputs, the plurality of outputs corresponding to a respective one of a plurality of antennas of an ICP chamber, and a combined mutual inductance of the plurality of inductances corresponding to the plurality of split signals is substantially equal to a combined mutual inductance of the plurality of antennas of the ICP chamber.

4. The RF power generator of claim 1 further comprising a matching network configured to receive the output signal from the RF power source and provide the output signal to the power splitter, the matching network configured to provide an impedance match with the RF power source.

5. The RF power generator of claim 1 wherein the demagnetizing circuit is positioned between the power splitter and a load.

6. The RF power generator of claim 1 wherein a load is positioned between the demagnetizing circuit and the power splitter.

7. The RF power generator of claim 1 wherein the plurality of inductances is two, and the demagnetizing circuit has an inner inductance and an outer inductance, wherein the inner inductance corresponds to an inner coil of an ICP chamber and the outer inductance corresponds to an outer coil of the ICP chamber.

8. The RF power generator of claim 1 wherein the plurality of inductances is three, and the demagnetizing circuit has an inner inductance, a middle inductance, and an outer inductance, wherein the inner inductance corresponds to an inner coil of an ICP chamber, the middle inductance corresponds to a middle coil of the ICP chamber, and the outer inductance corresponds to an outer coil of the ICP chamber.

9. A RF power generator comprising:
a RF power source configured to generate an output signal;
a power splitter configured to receive the output signal and generate a plurality of split signals; and
a demagnetizing circuit configured to receive the plurality of split signals, the demagnetizing circuit configured to include a plurality of coils corresponding to the plurality of split signals,
wherein the plurality of coils is configured to reduce the effects of mutual impedance of an inductively coupled plasma (ICP) chamber in series with a plurality of inductances so that a current ratio between a pair of the plurality of split signals varies substantially linearly as one of the pair of the plurality of split signals is varied.

10. The RF power generator of claim 9 wherein the demagnetizing circuit includes a plurality of outputs, the plurality of outputs corresponding to a respective one of a plurality of antennas of an ICP chamber, and a combined mutual inductance of the plurality of coils corresponding to the plurality of split signals is substantially equal to a combined mutual inductance of the plurality of antennas of the ICP chamber.

11. The RF power generator of claim 9 further comprising a matching network configured to receive the output signal from the RF power source and provide the output signal to the power splitter, the matching network configured to provide an impedance match with the RF power source.

12. The RF power generator of claim 9 wherein the demagnetizing circuit is positioned between the power splitter and a load.

13. The RF power generator of claim 9 wherein a load is positioned between the demagnetizing circuit and the power splitter.

14. The RF power generator of claim 9 wherein the plurality of coils is two, and the demagnetizing circuit has an inner coil and an outer coil, wherein the inner coil corresponds to an inner coil of an ICP chamber and the outer coil corresponds to an outer coil of the ICP chamber.

15. The RF power generator of claim 9 wherein the plurality of coils is three, and the demagnetizing circuit has an inner coil, a middle coil, and an outer coil, wherein the inner coil corresponds to an inner coil of an ICP chamber, the middle coil corresponds to a middle coil of the ICP chamber, and the outer coil corresponds to an outer coil of the ICP chamber.

16. A demagnetizing circuit for an ICP system comprising:
a first inductance, the first inductance configured to receive a first RF signal, wherein the first inductance is electrically connected to a first antenna of an ICP chamber; and
a second inductance, the second inductance configured to receive a second RF signal, wherein the second inductance is electrically connected to a second antenna of an ICP chamber;
wherein the first inductance and the second inductance are configured to reduce the effects of mutual impedance of an inductively coupled plasma (ICP) chamber in series with the first inductance and the second inductance so that a current ratio between the first RF signal and the second RF signal varies substantially linearly as one of the first RF signal or the second RF signal is varied.

17. The demagnetizing circuit for an ICP system of claim 16 wherein the first inductance may be one of a first coil having an inductance or a first induced inductance from conducting electrical current through a first electrical conductor and the second inductance may be one of a second coil having an inductance or a second induced inductance from conducting electrical current through a second electrical conductor.

18. The demagnetizing circuit for an ICP system of claim 16 wherein a combined mutual inductance of the first inductance and the second inductance is substantially equal to a combined mutual inductance of a first antenna and a second antenna of the ICP system.

19. The demagnetizing circuit for an ICP system of claim 16 wherein the demagnetizing circuit is positioned between a power splitter and a load.

20. The demagnetizing circuit for an ICP system of claim 16 wherein a load is positioned between the demagnetizing circuit and a power splitter.

* * * * *